(12) United States Patent
DeYoung et al.

(10) Patent No.: US 6,602,351 B2
(45) Date of Patent: *Aug. 5, 2003

(54) METHODS FOR THE CONTROL OF CONTAMINANTS FOLLOWING CARBON DIOXIDE CLEANING OF MICROELECTRONIC STRUCTURES

(75) Inventors: James P. DeYoung, Durham, NC (US); James B. McClain, Raleigh, NC (US); Stephen M. Gross, Chapel Hill, NC (US)

(73) Assignee: Micell Technologies, Inc., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/951,247

(22) Filed: Sep. 13, 2001

(65) Prior Publication Data

US 2002/0179126 A1 Dec. 5, 2002

Related U.S. Application Data

(63) Continuation-in-part of application No. 09/932,063, filed on Aug. 17, 2001, now Pat. No. 6,562,146.
(60) Provisional application No. 60/269,026, filed on Feb. 15, 2001.

(51) Int. Cl.[7] .................................................. B08B 3/00

(52) U.S. Cl. ................................. 134/36; 134/2; 134/3; 134/30; 134/34; 134/37; 134/42; 134/902; 438/906; 34/476; 510/175; 510/176

(58) Field of Search ............................ 134/1, 1.3, 2, 3, 134/30, 34, 36, 37, 42, 902; 438/906; 510/175, 176; 34/476

(56) References Cited

U.S. PATENT DOCUMENTS

| | | |
|---|---|---|
| 4,491,628 A | 1/1985 | Ito et al. |
| 4,980,264 A | 12/1990 | Chiong et al. |
| 5,071,730 A | 12/1991 | Allen et al. |
| 5,443,690 A | 8/1995 | Takechi et al. |
| 5,492,793 A | 2/1996 | Breyta et al. |

(List continued on next page.)

OTHER PUBLICATIONS

Cao, Heidi B., et al., *Comparison of resist collapse for deep ultraviolet and 193 nm resist platforms*, J. Vac. Sci. Technol., vol. B 18, No. 6, pp. 3303–3307 (Nov./Dec. 2000).

Mori, Shigeyasu, et al., *Pattern collapse in the top surface imaging process after dry development*, J. Vac. Sci. Technol., vol. B 16, No. 6, pp. 3744–3747 (Nov./Dec. 1998).

(List continued on next page.)

*Primary Examiner*—Randy Gulakowski
*Assistant Examiner*—M. Kornakov
(74) *Attorney, Agent, or Firm*—Myers Bigel Sibley & Sajovec

(57) ABSTRACT

A method of cleaning and removing water and entrained solutes during a manufacturing process from a microelectronic device such as a resist-coated semiconductor substrate, a MEM's device, or an optoelectronic device comprising the steps of: (a) providing a partially fabricated integrated circuit, MEM's device, or optoelectronic device having water, entrained solutes, and/or solid particles or the like on the substrate; (b) providing a densified (e.g., liquid or supercritical) carbon dioxide cleaning composition, the drying composition comprising carbon dioxide and, optionally but preferably, a cleaning adjunct; (c) immersing the surface portion in the densified carbon dioxide cleaning composition; and then (d) removing the cleaning composition from the surface portion.

19 Claims, 2 Drawing Sheets

U.S. PATENT DOCUMENTS

| | | | |
|---|---|---|---|
| 5,783,082 | A | 7/1998 | DeSimone et al. |
| 5,866,304 | A | 2/1999 | Nakano et al. |
| 5,868,856 | A | 2/1999 | Douglas et al. |
| 5,944,996 | A | 8/1999 | DeSimone et al. |
| 5,976,264 | A | 11/1999 | McCullough et al. |
| 6,024,801 | A | 2/2000 | Wallace et al. |
| 6,042,997 | A | 3/2000 | Barclay et al. |
| 6,067,728 | A | 5/2000 | Farmer et al. |
| 6,200,393 | B1 | 3/2001 | Romack et al. |
| 6,200,943 | B1 | 3/2001 | Romack et al. |
| 6,228,826 | B1 | 5/2001 | DeYoung et al. |
| 6,240,936 | B1 | 6/2001 | DeSimone et al. |
| 6,242,165 | B1 | 6/2001 | Vaartstra |
| 6,258,766 | B1 | 7/2001 | Romack et al. |
| 6,277,753 | B1 | 8/2001 | Mullee et al. |
| 6,306,564 | B1 | 10/2001 | Mullee |
| 6,331,487 | B2 | 12/2001 | Koch |

OTHER PUBLICATIONS

Namatsu, Hideo, et al., *Supercritical resist dryer, J. Vac. Sci. Technol.*, vol. B 18, No. 2, pp. 780–782 (Mar./Apr. 2000).

Namatsu, Hideo, *Supercritical drying for water–rinsed systems, J. Vac. Sci. Technol.*, vol. B 18, No. 6, pp. 3308–3312 (Nov./Dec. 2000).

Simons, John P. et al., *Aqueous–based photo resist drying using supercritical carbon dioxide to prevent pattern collapse, J. Vac. Sci. Technol.*, vol. B 18, No. 6, pp. 3313–3317 (Nov./Dec. 2000).

Spall, W. Dale, *Supercritical Carbon Dioxide Precision Cleaning for Solvent and Waste Reduction, International Journal of Environmentally Conscious Design & Manufacturing*, vol. 2, No. 1, pp. 81–86 (1993).

*Supercritical CO2 process offers less mess from semiconductor plants*, Abstract, *Chemical Engineering*, pp. 27–29 (Jul. 1998).

METHODS FOR THE CONTROL OF CONTAMINANTS FOLLOWING CARBON DIOXIDE CLEANING OF MICROELECTRONIC STRUCTURES

RELATED APPLICATIONS

This application is a continuation-in-part of commonly owned, co-pending application Ser. No. 09/932,063, filed Aug. 17, 2001 now U.S. Pat. No. 6,562,146, which in turn claims the benefit of Provisional Application Serial No. 60/269,026, filed Feb. 15, 2001, the disclosures of both of which are incorporated by reference herein their entirety.

FIELD OF THE INVENTION

The present invention concerns methods and apparatus for removing water and aqueous-borne solutes from substrates such as semiconductor substrates, MEM's, or optoelectronic devices with liquid or supercritical carbon dioxide

BACKGROUND OF THE INVENTION

Production of integrated circuits, microelectronic devices, and micro-electro mechanical devices, (MEM's) involve multiple processing steps many of which incorporate water as either a carrier of chemistry, or a media to facilitate the removal of process byproducts. The evolution of materials and processes has been lead by a drive toward smaller feature sizes and more complex microdevices. In some cases, the use of water in these evolving processes has resulted in challenges whereby deleterious effects of water and byproducts carried by water have been seen. The unique physical properties of dense carbon dioxide in a liquid or supercritical state are of particular interest in preventing certain of these pitfalls.

One such process where dense $CO_2$ is of practical application relates to prevention of surface tension or capillary force induced image collapse. This is of particular interest during the aqueous development of micro-lithographic images using photoresists. Photoresists are photosensitive films used for transfer of images to a substrate. A coating layer of a photoresist is formed on a substrate and the photoresist layer is then exposed, through a photomask or by other techniques, to a source of activating radiation. Exposure to activating radiation provides a photoinduced chemical transformation of the photoresist coating to thereby transfer the pattern of the photomask (or other pattern generator) to the photoresist coated substrate. Following exposure, the photoresist is developed to provide a relief image that permits selective processing of a substrate. See. e.g., U.S. Pat. No. 6,042,997.

A photoresist can be either positive-acting or negative-acting. For negative acting resists, the solubility of the exposed region is decreased such that it remains on the wafer during development while the non-exposed region is removed. For positive acting resists the solubility of the exposed region increases in the developer solution, so it is removed during the development step leaving the unexposed region unaffected. Positive and negative acting resist materials typically incorporate chemical functionality that undergoes a transformation upon exposure to UV light at a given wavelength. The transformation is often referred to as a "polarity switch" because polymer polarity increases or decreases are often the driving force for changes in the solubility of the polymer in the developing solution. This transformation is facilitated by the incorporation of photo-acid generators (PAG's) or photobase generators (PGB's) into the resist compositions. The acid and base moieties are typically generated upon exposure to the appropriate source of radiation followed by heat. The developer solutions are typically aqueous, and are typically dried from the substrate before further processing.

Capillary forces present in the aqueous drying of imaged resist patterns can result in resist deformation and pattern collapse. This problem becomes particularly serious as lithography techniques move toward smaller image nodes with larger aspect ratios. Researchers have suggested that collapse problems associated with aqueous drying will affect the 130-nm technology node, and will become more prevalent in subsequent technologies as aspect ratios increase.

Researchers at both IBM and NTT have suggested that the use of carbon dioxide in supercritical resist drying (SRD) may reduce image collapse and film damage. See, e.g., H. Namatsu, *J. Vac. Sci. Technol. B* 18(6), 3308–3312 (2000); D. Goldfarb et al., *J. Vac. Sci. Technol B.* 18(6) 3313–3317 (2000). However, while the absence of surface tension and the accessible critical temperature and pressure of $CO_2$ have been touted as positives factors for this drying approach, the relatively low solubility of water in the supercritical phase has also been described as a challenge that may necessitate the use of chemical adjuncts to increase the transport capacity of the fluid. Researchers at IBM and NTT have demonstrated the use of certain surfactants in supercritical fluid-aided drying. However, the surfactant is described as being incorporated into a hexane pre-rinse in "indirect SRD" See, e.g., Goldfarb et al., supra, or only particular surfactants have been incorporated into the carbon dioxide in "direct SRD". In both the direct and indirect drying methods the choice of surfactants and co-solvents is limited by what is described as compatibility issues leading to resist damage. Accordingly, there remains a need for new approaches to SRD using carbon dioxide.

Another problem with drying of surfaces on microelectronic substrates (e.g. photoresist coated semiconductor wafers, MEMS, opto-electronic devices, photonic devices, flat panel displays, etc) is the complete removal of aqueous processing, cleaning or rinsing solutions without leaving a residue, commonly referred to as a drying watermark. These watermarks result from the concentration of solutes in the aqueous processing, cleaning, or drying fluid, as said fluid is dried. In many microelectronic, optical, micro-optical, or MEMS structures this watermark can negatively impact the manufacturing yield or ultimate performance of the device. There needs to be an effective method to remove (clean) water-based fluids from surfaces that eliminates the concentration and ultimate deposition of entrained solutes—eliminating watermarks.

One such challenge comes in the manufacturing of MEM's devices. Wet-processing steps generally culminate with a rinse and dry step. Evaporative drying causes water with low levels of solutes that is pooled on the surface and in various micro-features to concentrate in locations that maximize the surface area of the pool. As a result, these drying steps can lead to the concentration of once dissolved solutes in close proximity to or on motive parts. The deposited materials which can be organic or inorganic in nature contribute to stiction, the locking of the motive part such that it cannot be actuated. "Release stiction" as it is termed during the manufacturing step results, is believed to be derived from adhesive and Van der Waals forces and friction. The forces generated by this phenomenon can completely incapacitate motive parts on MEM's devices.

To combat stiction manufacturers of MEM's devices use solvents such as small chain alcohols that reduce surface tension during the rinse step and facilitate a more even drying process. However, these steps alone have not eliminated the occurrence of stiction. Supercritical $CO_2$ has been proposed for drying microstructures, (see Gregory T. Mulhern "Supercritical Carbon Dioxide Drying of Micro Structures") where surface tension forces can cause damage. Researchers at Texas Instruments Inc. among others (see, e.g., U.S. Pat. No. 6,024,801) have demonstrated that supercritical $CO_2$ can be used to clean organic and inorganic contaminants from MEM's devices prior to a pacification step, thus limiting stiction.

These technologies utilizing supercritical $CO_2$ do not limit stiction by combination of drying and cleaning where water and solutes are removed simultaneously so to avoid the concentration of water and solutes at specific site. Technologies are needed that can prevent release stiction through an integrated process of drying, cleaning, and surface pacification.

Other examples of drying and cleaning challenges related to aqueous wet-processing steps come in the formation of deep vias for interlayer metalization in the production of integrated circuits. These vias, formed by methods known to those familiar with the art, typically have large critical aspect ratios creating geometries that can be difficult to clean residues from. Furthermore, wet-processing steps and rinses with traditional fluids such as water leave once dissolved solutes behind upon evaporative drying. These solutes deposited at the bottom of the vias can inhibit conduction upon metalization lowering functional yields.

Technologies are needed that remove water (dry) and dissolved solutes (clean) from vias after wet processing steps, thus reducing yield losses.

SUMMARY OF THE INVENTION

A first aspect of the present invention is a method of cleaning a microelectronic device, comprising the steps of: providing a substrate having a surface portion to be cleaned, providing a densified carbon dioxide cleaning composition, the composition comprising carbon dioxide and, optionally but preferably a cleaning adjunct (e.g., cosolvents, surfactants, and combinations thereof); immersing the surface portion in the densified carbon dioxide composition; and then removing the cleaning composition from the surface portion.

Examples of devices that may be cleaned by the present invention include, but are not limited to, microelectromechanical devices (MEMs), optoelectronic devices, and resist-coated substrates.

In a preferred embodiment, process parameters are preferably controlled so that the cleaning composition is maintained as a homogeneous composition during the immersing step, the removing step, or both the immersing and removing step, without substantial deposition of the drying adjunct or the entrained solutes on the resist coating, the patterned feature, or the mechanical, electrical, or optical components of the device or circuit.

The resist typically comprises a polymeric material, and may be a positive-acting resist or a negative-acting resist. The resist may be patterned or unpatterned, developed or undeveloped at the time the drying process is carried out.

The present invention is explained in greater detail in the drawings and specification set forth below.

DETAILED DESCRIPTION OF THE PREFERRED EMBODIMENTS

Figure 1:
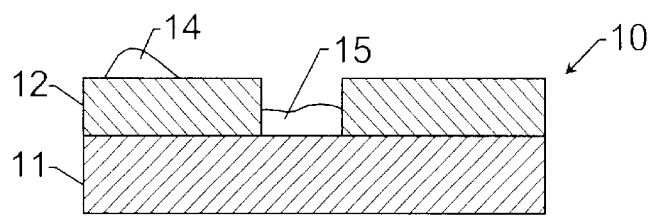
FIG. 1 shows a substrate having a patterned resist layer formed thereon, with water present in various locations thereon.

Examples of devices that may be cleaned by the present invention include, but are not limited to, microelectromechanical devices (MEMs), optoelectronic devices, and resist-coated substrates.

Any suitable resist composition can be used to carry out the present invention, including but not limited to those described in U.S. Pat. Nos. 6,042,997; 5,866,304; 5,492,793; 5,443,690; 5,071,730; 4,980,264; and 4,491,628. Applicants specifically intend that the disclosures of all United States patent references that are cited herein be incorporated herein by reference in their entirety.

The resist compositions may be applied to the substrate as a liquid compositions in accordance with generally known procedures, such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions are suitably applied to substrates conventionally used in processes involving coating with photoresists. For example, the composition may be applied over silicon wafers (that may include one or more layers thereon such as silicon dioxide, silicon nitride, polysiloxand and/or metal, etc.) for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Alternatively it may be dried by the procedures described herein. Thereafter, it is imaged in a conventional manner. The exposure is sufficient to effectively activate the photoactive component of the photoresist system to produce a patterned image in the resist coating layer.

Following exposure, the film layer of the composition may be baked. Thereafter, the film is developed by contacting the film resist layer to any suitable developer solution (the choice of which will depend in part upon the particular choice of resist material). For example, the developer may be a polar developer, for example an aqueous based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures. After development the resist is optionally rinsed (for example with an aqueous rinse) and is then dried, preferably by the drying procedures described herein.

Following development of the photoresist coating over the substrate, the developed substrate may be selectively processed on those areas bared of resist, for example by chemically etching or depositing on substrate areas bared of resist in accordance with procedures known in the art. For the manufacture of microelectronic substrates, e.g., the manufacture of silicon dioxide wafers, suitable etchants include a gas etchant, e.g. a chlorine or fluorine-based etchant such a $CF_4$ or $CF_4/CHF_3$ etchant applied as a plasma stream, in accordance with known techniques.

Carbon-dioxide cleaning drying compositions used to carry out the present invention typically comprise:

(a) carbon dioxide to balance, typically at least 20, 30, 40, 50 or 60 percent;

(b) from 0, 0.01, 0.1, 0.5, 1 or 2 percent to 5 or 10 percent or more of surfactant;

(c) from 0, 0.01, 0.1, 1 or 2 to 30, 40 or 50 percent or more of an organic co-solvent; and (d) optionally, from 0, 0.01, or 0.1 to 2 or 5 percent water.

Preferably at least one of the surfactant and/or the co-solvent is included (e.g., by at least 0.01 percent) in the cleaning/drying composition, and optionally both a surfactant and a co-solvent may be included in the composition. Water may or may not be included in the composition, depending upon the particular cleaning application and the nature of the substrate. Percentages herein are expressed as percentages by weight unless otherwise indicated.

The cleaning/drying composition may be provided as a liquid or supercritical fluid, including cryogenic liquids. Liquid and supercritical carbon dioxide are herein together referred to as "densified" carbon dioxide in accordance with established usage.

The organic co-solvent may be one compound or a mixture of two or more ingredients The organic co-solvent may be or comprise an alcohol (including diols, triols, etc.), ether, amine, ketone, carbonate, or alkanes, or hydrocarbon (aliphatic or aromatic) The organic co-solvent may be a mixture of compounds, such as mixtures of alkanes as given above, or mixtures of one or more alkanes in combination with additional compounds such as one or more alcohols as described above. (e.g., from 0 or 0.1 to 5% of a C1 to C15 alcohol (including diols, triols, etc.)). Any surfactant can be used to carry out the present invention, including both surfactants that contain a $CO_2$-philic group (such as described in PCT Application WO96/27704) linked to a $CO_2$-phobic group (e.g., a lipophilic group) and surfactants that do not contain a $CO_2$-philic group (i.e., surfactants that comprise a hydrophilic group linked to a hydrophobic (typically lipophilic) group). A single surfactant may be used, or a combination of surfactants may be used. Numerous surfactants are known to those skilled in the art. See, e.g., McCutcheon's Volume 1: Emulsifiers & Detergents (1995 North American Edition) (MC Publishing Co., 175 Rock Road, Glen Rock, N.J. 07452). Examples of the major surfactant types that can be used to carry out the present invention include the: alcohols, alkanolamides, alkanolamines, alkylaryl sulfonates, alkylaryl sulfonic acids, alkylbenzenes, amine acetates, amine oxides, amines, sulfonated amines and amides, betaine derivatives, block polymers, carboxylated alcohol or alkylphenol ethoxylates, carboxylic acids and fatty acids, a diphenyl sulfonate derivatives, ethoxylated alcohols, ethoxylated alkylphenols, ethoxylated amines and/or amides, ethoxylated fatty acids, ethoxylated fatty esters and oils, fatty esters, fluorocarbon-based surfactants, glycerol esters, glycol esters, hetocyclic-type products, imidazolines and imidazoline derivatives, isethionates, lanolin-based derivatives, lecithin and lecithin derivatives, lignin and lignin derivatives, maleic or succinic anhydrides, methyl esters, monoglycerides and derivatives, olefin sulfonates, phosphate esters, phosphorous organic derivatives, polyethylene glycols, polymeric (polysaccharides, acrylic acid, and acrylamide) surfactants, propoxylated and ethoxylated fatty acids alcohols or alkyl phenols, protein-based surfactants, quaternary surfactants, sarcosine derivatives, silicone-based surfactants, soaps, sorbitan derivatives, sucrose and glucose esters and derivatives, sulfates and sulfonates of oils and fatty acids, sulfates and sulfonates ethoxylated alkylphenols, sulfates of alcohols, sulfates of ethoxylated alcohols, sulfates of fatty esters, sulfonates of benzene, cumene, toluene and xylene, sulfonates of condensed naphthalenes, sulfonates of dodecyl and tridecylbenzenes, sulfonates of naphthalene and alkyl naphthalene, sulfonates of petroleum, sulfosuccinamates, sulfosuccinates and derivatives, taurates, thio and mercapto derivatives, tridecyl and dodecyl benzene sulfonic acids, etc.

FIG. 1 illustrates a resist-coated substrate article 10 to be dried by the method of the present invention. The article comprises a substrate 11, which may comprise silicon or any other suitable material as described above, and which may itself comprise one or more layers, having a resist coating 12 formed thereon. Water droplets 14, 15, to be removed by drying, are on the top surface and in a trench formed in the resist coating.

Figure 2:
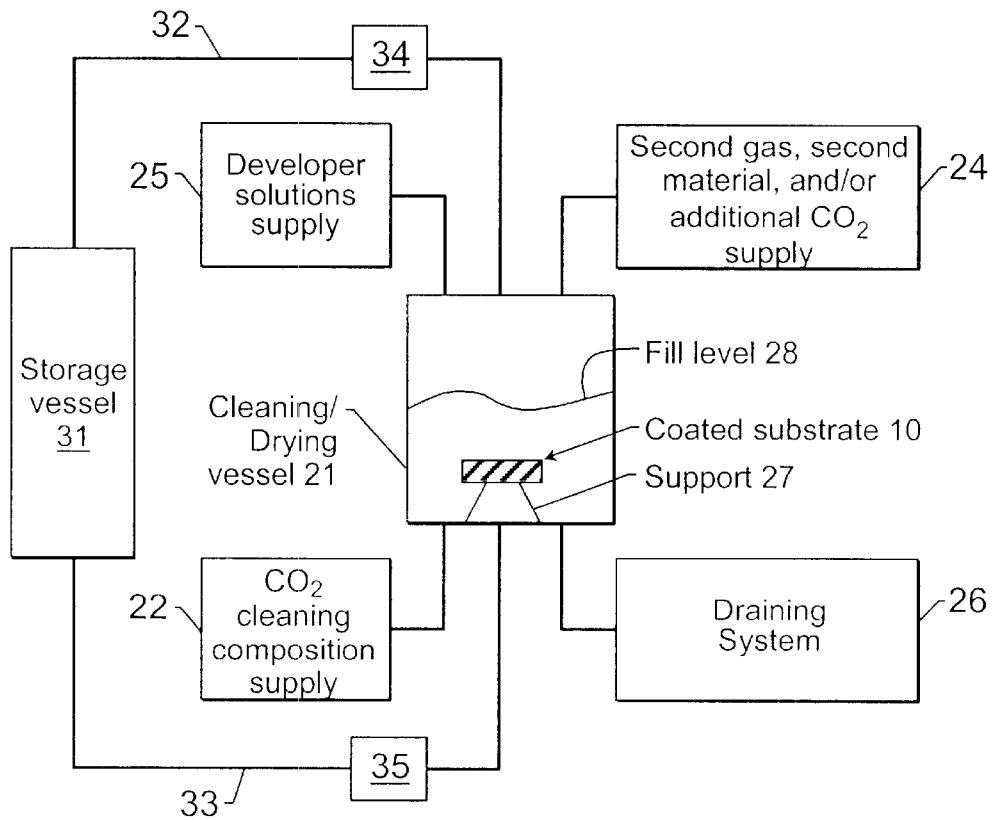
FIG. 2 schematically illustrates an apparatus for carrying out the methods of the present invention.

FIG. 2 schematically illustrates an apparatus for carrying out the method of the invention. The apparatus comprises an enclosed drying vessel 21, suitable for containing liquid or supercritical carbon dioxide, in which vessel the coated substrate 10 (or other microelectronic device to be cleaned) is positioned on a suitable support 27. The drying vessel may include a door, a stirring device or other means of agitation, a view window, a compressor connected to the drying vessel to increase or decrease the pressure therein, a heat exchanger, heater or cooler connected to the drying vessel to increase or decrease the temperature of the contents thereof, etc.

A carbon dioxide cleaning/drying composition supply 22 is connected to the drying vessel by appropriate piping. The cleaning/drying composition supply 22 may itself comprise one or more storage vessels, pumps, valves, piping for mixing the drying adjunct into the carbon dioxide, etc. The vessel may be filled with the cleaning/drying composition to a level 28 above the article to be cleaned 10.

Depending upon the particular technique or combination of techniques being employed to control the processing conditions, the system includes a supply of a second gas, second material, and/or additional carbon dioxide 24 connected to the drying vessel 21.

If desired, a developer solution supply 25 may be connected to the vessel so that both development and drying of the substrate may be carried out in the same vessel 21.

A draining system 26 is preferably connected to the vessel 21 for draining whatever composition is contained therein. The draining system may itself comprise appropriate pumps, valves, compressors and the like (some of which components may be serve multiple functions in conjunction with supply elements described above), may include a still for distilling and optionally recycling ingredients such as carbon dioxide, and may include suitable piping, valves, etc. for recycling various compositions or constituents thereof to supply elements for re-use. For example, used drying composition may be distilled to allow carbon dioxide to be recycled and reused as part of the drying composition, or to the source of additional carbon dioxide supply.

As noted above, the method of the invention comprises the steps of:
  (a) providing a substrate having a an imaged or patterned feature such as a resist coated silicon wafer and having water on the resist coating;
  (b) providing a densified (e.g., liquid or supercritical) carbon dioxide drying composition, the drying composition comprising carbon dioxide and a drying adjunct, the drying adjunct selected from the group consisting of cosolvents, surfactants, and combinations thereof;
  (c) immersing the surface portion in the densified carbon dioxide drying composition; and then
  (d) removing the drying composition from the surface portion.

The process parameters may be controlled so that the drying composition is maintained as a homogeneous composition during the immersing step, the removing step, or both the immersing and removing step, without substantial deposition or redeposition of the drying adjunct or contaminants on the resist coating.

Preferably, the providing step is carried out by mixing the carbon dioxide with the adjunct to produce a homogeneous solution, and then the immersing step is carried out while maintaining the drying composition as a homogeneous solution. Such mixing can be carried out in the drying composition supply 22 by any suitable means, such as stirring, injection under pressure, etc.

The removing step is preferably carried out while maintaining the drying composition as a homogeneous solution. In general, this is achieved by inhibiting the boiling of the drying composition as it is drained from the drying vessel. When draining liquid $CO_2$ from a vessel the liquid reaches a state where it is at equilibrium with $CO_2$ vapor, termed saturated vapor pressure. To maintain saturation, as liquid is removed from the vessel by venting or pumping preferably from the bottom of the vessel, the liquid phase boils to generate vapor for the increasing volume of the vapor phase. This boiling which may be nucleated at liquid/gas, and liquid/solid interfaces causes adjuncts with lower vapor pressure than $CO_2$ including, co-solvents and surfactants, and solute contaminants to concentrate at interfaces. Concentrated adjuncts, deposited contaminants and interfacial stresses created by boiling at liquid/solid interfaces can be damaging to resist features, MEM's, or other patterned microdevices. In the case of imaged and developed resists, feature sizes less 130-nm with aspect ratios greater than 3 are particularly susceptible to damage. Process controls to prevent such damage are as follows.

For example, when the drying composition is a liquid drying composition, the removing step may be carried out by pressurizing the enclosed chamber with a second compressed gas (e.g., helium, nitrogen, air, mixtures thereof) from supply 24 by an amount sufficient to inhibit boiling of the drying composition during the draining step. The second gas is preferably one that is substantially immiscible in the drying composition possessing a saturated vapor pressure that is higher than $CO_2$. The second gas may be used to itself force the drying composition from the vessel, or the drying composition may be pumped or otherwise drained from the vessel while the second gas maintains an over-pressurization at the gas-liquid interface formed in the wash vessel during draining thereof.

Alternatively, if the drying composition is in the liquid phase, the draining step can be accomplished without boiling by liquid-gas equilibration with a secondary chamber or storage vessel. In this scenario, drying chamber 21 is connected to storage vessel 31 by gas-side line 32 (top), and liquid-side line 33. Each line contains a valve 34, 35 to separate or isolate vessels 21 and 31 from one another. During the draining step, storage vessel 31 contains a liquid $CO_2$ composition at a saturated pressure equal to or in excess of the saturated vapor pressure in the cleaning/drying vessel 21. Draining may be accomplished by first opening the gas-side connection 32 between vessels 21 and 31, and then opening the liquid-side connection 33. Liquid flows from cleaning vessel 21 to storage vessel 31 by gravity, if 21 is located sufficiently above 31, and/or by pumping. Liquid transfer described above avoids boiling thereby avoiding potential damage to resist features or other device features.

When the drying composition is a supercritical drying composition there will not be a gas-liquid interface. In this case, the removing step may be carried out by first adding a second material (e.g., a cosolvent as described above or a secondary gas) to the supercritical drying composition so that it is converted to a liquid drying composition, which can then be removed from the vessel as described above. If a secondary gas is used to cause the supercritical fluid phase to change to a liquid, the gas should be chosen from those having a saturated vapor pressure that is higher than that of $CO_2$ and/or a critical pressure and temperature higher than that of $CO_2$. Exemplary gases include but are not limited to: nitrogen, argon, helium, oxygen, and mixtures thereof.

Figure 3:
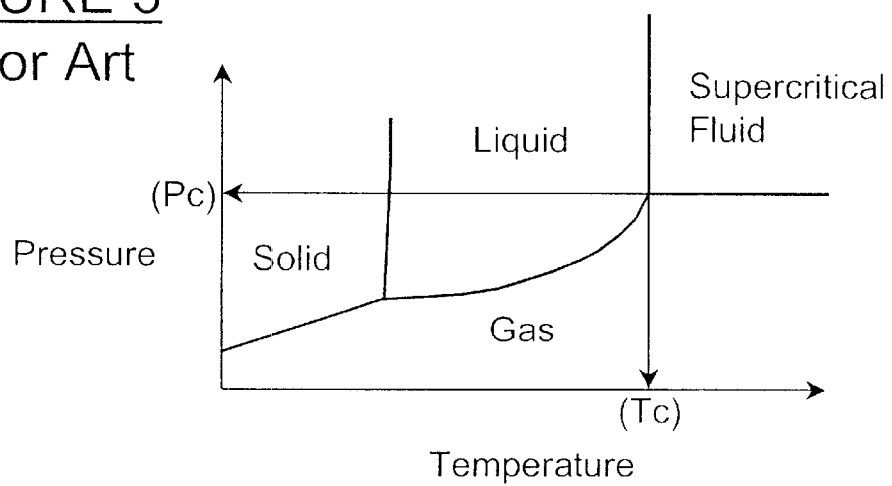
FIG. 3 depicts a phase diagram of predominantly $CO_2$ system representing the plausability of a transition from a predominantly $CO_2$ supercritical mixture to a gas avoiding a liquid phase.

Alternatively, when the drying composition is in the supercritical state, the adjunct containing fluid can be sufficiently diluted prior to the draining step by simultaneous addition of pure supercritical $CO_2$ and removal of adjunct-containing supercritical $CO_2$. After sufficient fluid turnover is accomplished and adjunct concentration is effectively minimized, the supercritical fluid is vented from the drying vessel by maintaining the fluid in the supercritical state until a transition is made directly to the gas state thus avoiding the liquid state. This is accomplished during the draining/venting step by maintaining the fluid temperature above the critical temperature of the mixture (Tc) until the pressure in the vessel is below the critical pressure of the mixture (Pc). FIG. 3 depicts a phase diagram of predominantly $CO_2$ system representing the plausibility of a transition from a predominantly $CO_2$ supercritical mixture to a gas avoiding a liquid phase. Because the expansion of the supercritical fluid and subsequent expansion of the remaining gas is an endothermic process, heat may need to be added to the system to maintain the temperature of the fluid or gas above the critical temperature thus avoiding condensation of the supercritical fluid or gas to a liquid or solid. By effecting a direct transition from the supercritical phase to the gas phase, liquid boiling is avoided thereby avoiding the interfacial stress caused by a retracting liquid meniscus at the liquid/solid interface, and unwanted deposition of solutes onto and in microstructures.

In another embodiment, the removing step is carried out by diluting the drying composition with additional carbon dioxide from supply 24, during which dilution the drying composition is removed from the vessel by draining system 23. Since larger quantities of carbon dioxide are required for such a technique, the use of a still to distill drained carbon dioxide, along with appropriate piping and valving for returning the carbon dioxide to supply 22 or supply 24 for subsequent re-use, is preferred.

In still another embodiment, a secondary gas is used, at a pressure range above the saturation point of $CO_2$ gas, to displace liquid and gaseous $CO_2$ in the drying chamber leaving a predominance of the secondary gas in the vapor phase. The secondary gas, possessing a lower heat of compression, can be vented from the chamber to ambient pressure with less heat loss to the system. Also represented by a smaller Joule-Thomson coefficient, ($\mu$), the expansion of the gas from high pressure to atmospheric conditions results in less change in temperature at or in close proximity to the substrate. ($\mu_{CO2} > \mu_X$, where X=secondary gas).

$$\mu = (dT/dP)_H$$

In this embodiment, the secondary gas is useful in avoiding thermal shock when rapid cycling of pressure is desired for high throughput. Substrates such as silicon wafers can crack or become damage when significant temperature gradients exist in that substrate. Cooling of chambers and vessels from gaseous expansion can also add valuable processing time and require substantial heat input for temperature regulation. The use of a secondary gas can minimize heat loss and heat inputs, potentially reducing cycle time and energy requirements.

Methods for the Control of Contaminants Following Carbon Dioxide Cleaning of Microelectronic Structures. Contaminants removed from surfaces features of microelectronic substrates after ion implantation, 'back end of the line' (BEOL) cleaning processes, 'front end of the line' (FEOL) cleaning processes, and post CMP steps vary in nature and composition dramatically. Accordingly, cleaning steps must address these contaminants with the appropriate chemistries and solvents to either react with, ionize, dissolve, swell, disperse, emulsify, or vaporize them from the substrate. As such, a variety of water and solvent-based systems, and dry cleaning processes exist to address the broad variety of waste materials.

Common to all cleaning processes, however, is the need to completely remove all contaminants, and adjuncts from the substrate leaving the substrate free, substantially free or essentially free of organic, inorganic, metallic, or composite waste mater (e.g., the amount of contaminants left after the process is completed is not more than 5%, 1%, 0.5%, 0.1%, 0.05%, 0.01%, 0.005%, 0.001%, or less, by weight of the amount of contaminant prior to the cleaning process)). These foreign materials often seen in residues from wet-cleaning processes, often referred to as watermarks, can dramatically and detrimentally affect the ultimate performance of integrated circuits and other microelectronic devices. This is traditionally minimized in wet-cleaning and solvent based cleaning processes by using copious amounts of ultra-pure water and/or solvents for rinse steps. In these processes, fluid streams are directed in a fashion that sweeps contaminants away from the substrate such that redeposition of mater is minimized. These rinsing practices result in large quantities of aqueous and solvent-based waste streams that are increasing as device feature sizes continue to shrink. Vapor-phase dryers, such as IPA dryers, are also commonly used to minimize the occurrence of watermarks or waterspots.

Figure 4:
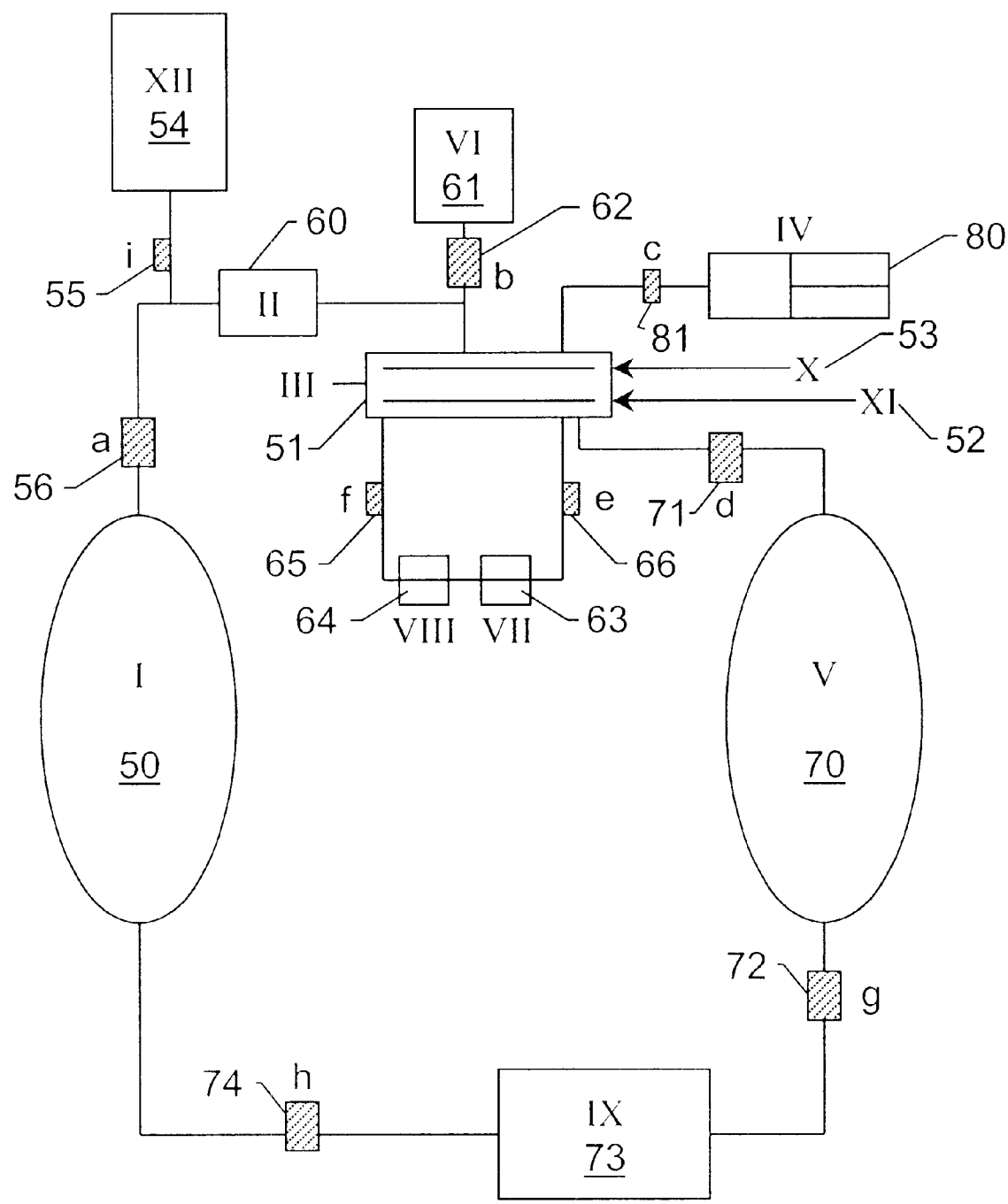
FIG. 4 schematically illustrates an apparatus for carrying out the methods of the present invention.

Liquid and supercritical $CO_2$-based cleaning and drying processes have been proposed in the manufacturing of microelectronic substrates. Processing methodologies that effectively eliminate the redeposition of contaminants onto and into the surface features of microelectronic substrates during or subsequent to cleaning steps are needed. The processes disclosed herein accomplish this task while also advantageously minimizing the extraneous use of processing rinse fluid that would result from patterned flow and waste scenarios. FIG. 4 represents a basic process diagram for a general description of the invention.

During or carbon dioxide cleaning steps fluid in the chamber may be in the supercritical state or the liquid state. Furthermore, liquid $CO_2$ compositions can be at the saturation point, termed saturated liquid $CO_2$ (liquid and gas co-existing in some proportion), or it can be compressed (no liquid meniscus). For the purposes of this invention each scenario will be described separately.

Removing Supercritical $CO_2$ Compositions and Contaminants from Cleaning Chambers Avoiding Re-Deposition of Cleaning Adjuncts and Contaminants and Minimizing Rinse Volumes.

Cleaning steps using $CO_2$ may use a variety of chemical adjuncts including co-solvents, surfactants, reactants, water, and combinations of some or all to enable or facilitate the quantitative removal of contaminants. These materials may be suspended, dissolved, dispersed, or emulsified in the carbon dioxide continuous phase. The stability of suspensions, dispersions, emulsions, and even solutions of materials in supercritical $CO_2$ as well as liquid is largely a function of $CO_2$ fluid density. Generally speaking, as the density of the $CO_2$ continuous phase decreases the stability of suspensions, dispersions, or emulsions also decrease. Since removal of $CO_2$ mass through draining or venting of the cleaning chamber mandates gradual to rapid reductions in fluid density, this process can result in the undesirable collapse of materials, termed redeposition in the case of contaminants and deposition in the case of adjuncts, onto the substrate. Consistent with conventional cleaning processes, copious amounts of ultra-pure rinse fluid, in this case $CO_2$, can be used to dilute the adjunct plus contaminant mixture prior to the venting step such that minimal redeposition is encountered. This can be disadvantageous based on required fluid volumes and processing cycle times.

The current invention circumvents the above-described problems as described in the context of FIG. 4. Supercritical processing fluid containing some level of contaminants and/or adjuncts either prior to a rinse step or subsequent to a rinse step is removed without deposition or redeposition of materials onto the substrate. Chamber I (50) represents the cleaning chamber. Pressure vessel II (51) represents a storage tank for processing fluid after cleaning. It can be integrated with abatement or recycling systems as desired. Subsystem III (52) represents a source of clean (i.e., sufficiently clean to achieve the desired level of cleanness/lack of redeposition of contaminants on the substrate) gaseous or supercritical components that can be a secondary gas with a saturated vapor pressure that exceeds that of carbon dioxide, or can be heated carbon dioxide in the supercritical phase or gas phase. Exemplary secondary gases include: helium, nitrogen, argon, and oxygen, or mixtures thereof. In the present invention, contaminated supercritical fluid is removed from the processing chamber by providing a secondary source of gas from system III 52 through valve (b) 53 at a pressure that exceeds the pressure in the processing chamber (I). Rapid mixing of the secondary gas with the supercritical fluid will transition the continuous phase to a liquid composition. Nearly simultaneous with the opening of valve (b), valve (c) 54 is opened between chamber (I) and vessel (II) to allow for removal of the $CO_2$ plus contaminants in a plug flow or draining fashion. Valve (b) remains open providing chamber (I) a continuous flow of secondary gas until all fluid mater is forced from chamber (I) at which point valves (b) and (c) are closed. Throughout this operation, the pressure in vessel (II) is maintained at a lower pressure than chamber (I).

Alternatively, system (III) can supply the chamber (I) with a heated source of supercritical $CO_2$ at a pressure and temperature that exceeds that of the processing fluid in chamber (I). Ideally the supercritical $CO_2$ added from system (III) has a lower density than that in chamber (I). In this case, the mixing of $CO_2$ fluids of varied density is accompanied by rapid flow of mass out of chamber (I) into vessel (II). The flushing action removes $CO_2$ plus contaminants from the cleaning chamber. The process can be used as a final drain followed by a vent or in conjunction with a series of fill and drain sequences preceding a final vent.

Removing Liquid $CO_2$ Compositions and Contaminants from Cleaning Chambers Avoiding Re-Deposition of Cleaning Adjuncts and Contaminants and Minimizing Rinse Volumes.

Liquid $CO_2$ compositions can be removed from cleaning chambers without the deposition of adjuncts or redeposition of contaminants using the following sequence that incorporate a secondary gas such as helium or nitrogen, or gaseous or supercritical $CO_2$. In the first case, liquid compositions are removed from chamber (I) by first opening valve (b) to system (III) where system (III) contains a secondary gas at a pressure greater than that in chamber (I). Nearly simultaneously or shortly after, valve (c) 54 is opened between chamber (I) and vessel (II) allow for forced plug flow of the liquid composition from chamber (I). After complete removal of liquid from (I), valves (c) 54 and (b) 53 are closed. This process can be used as a final removal drain step prior to venting or in a sequence of fill and drain steps. Alternatively, heated gaseous $CO_2$ or supercritical $CO_2$ is supplied from system (III) using the same process steps. In the case of gaseous $CO_2$ the pressure and temperature of the gas must exceed that of the processing fluid in chamber (I) to be removed. In the case of supercritical $CO_2$ being supplied by system (III), the fluid is supplied at a temperature and pressure that exceeds that of the fluid in chamber (I) so long as the density of the fluid is less than that of the liquid in chamber (I). Any condensation of gas or supercritical $CO_2$ to a liquid as mass rapidly flows from (III) to (I) to (II) may benefit the process by providing a surface rinsing action during the drain flush step. Again, this process can be used as a final removal or flush step prior to chamber venting or in a series of fill and drain steps preceding a final vent.

Alternatively, if the cleaning chamber is using liquid $CO_2$ compositions at saturated vapor pressure the fluid composition can be drained in the following steps to avoid deposition of materials onto the substrate surface. In this case, liquid $CO_2$ at saturated vapor pressure is maintained in vessel (II) prior to the draining or flushing step. The liquid composition is drained from (I) by first opening valve (e) 55 connecting the vapor-phase side of (I) with the vapor-phase side of (II), then opening valve (c) 54 connecting the liquid side of (I) with the vapor side of (II). By force of gravity, this allows the flow of liquid out of (I) without boiling liquid in chamber (I). The boiling of liquid is prevented to avoid the deposition of entrained materials onto surfaces. Vapor side communication (i.e., a vapor communication passage to permit vapor flow) is preferably provided between the two chambers. Once again, this process can be used as a final removal or drain step prior to chamber venting or in a series of fill and drain steps preceding a final vent.

The present invention is explained in greater detail in the following non-limiting Examples

COMPARATIVE EXAMPLE A

Treatment of a Coated Wafer with Liquid Carbon Dioxide

A $CO_2$-miscible, hydrophilic solvent, such as isopropanol (IPA), was added to a high-pressure vessel that contained a piece of a poly(hydroxystyrene) (PHS) coated silicon wafer. Liquid $CO_2$ was added to the high-pressure vessel. As the liquid $CO_2$/IPA (2% IPA by volume) mixture meniscus level rose above the surface of the wafer, damage to the wafer was observed. After the system was mixed for 15 minutes, the liquid $CO_2$/IPA mixture was drained from the bottom of the high-pressure vessel. More damage to the wafer was observed as the IPA boiled at the liquid/gas/wafer interface.

EXAMPLE 1

Treatment of a Coated Wafer with Liquid Carbon Dioxide

Liquid $CO_2$ was added to a high-pressure vessel that contained a piece of a PHS coated silicon wafer until the wafer was completely submerged in liquid $CO_2$. A mixture that contained liquid $CO_2$ and IPA, 2% IPA by volume, (alternatively any $CO_2$-miscible, hydrophilic solvent, or any hydrophilic/$CO_2$-philic surfactant) was added to the high-pressure vessel that contained the piece of PHS coated silicon wafer submerged in liquid $CO_2$. No damage to the wafer was observed. The system was mixed for 15 minutes. There was still no damage to the wafer. A secondary gas (helium or nitrogen) was added to the top of the high-pressure vessel. The liquid $CO_2$/IPA mixture was drained under the pressure of the secondary gas to prevent boiling at the liquid/gas/wafer interface. There was no damage to the wafer after the system was drained with a secondary gas. The system was rinsed with pure liquid $CO_2$ and was then drained as mentioned above. There was no damage to the wafer.

EXAMPLE 2

Treatment of a Coated Wafer with Liquid Carbon Dioxide

Liquid $CO_2$ at its saturated vapor pressure was added to a high-pressure vessel that contained a piece of a PHS coated silicon wafer until the wafer was completely submerged in liquid $CO_2$. A mixture that contained liquid $CO_2$ and IPA, 2% IPA by volume, (alternatively any $CO_2$-miscible, hydrophilic solvent, or hydrophilic/$CO_2$-philic surfactant) was added to the high-pressure vessel that contained the piece of PHS coated silicon wafer submerged in liquid $CO_2$. No damage to the wafer was observed. The liquid $CO_2$ mixture was drained from the high-pressure vessel to another high-pressure vessel containing predominantly liquid $CO_2$ at saturated vapor pressure by first opening a valve connecting the vapor side of both vessels then by opening a valve connecting the liquid side of both vessels. The liquid was drained by force of gravity as the first vessel was positioned substantially above the second to allow for complete drainage. No damage was observed. Pure liquid $CO_2$ was added to the vessel containing the wafer segment as a rinse, and that liquid was subsequently drained in the manor described above. Again, no damage was observed.

EXAMPLE 3

Treatment of a Coated Wafer with Liquid and Supercritical $CO_2$

Liquid $CO_2$ was added to a high-pressure vessel that contained a piece of a PHS coated silicon wafer until the wafer was completely submerged in liquid $CO_2$. A mixture that contained liquid $CO_2$ and IPA, 2% IPA by volume, (alternatively any $CO_2$-miscible, hydrophilic solvent or surfactant that increased the carry capacity of $CO_2$ for water) was added to the high-pressure vessel that contained the piece of PHS coated silicon wafer submerged in liquid $CO_2$. No damage to the wafer was observed. After a period of time sufficient to remove the substantial majority of the water from the surface of the wafer, the liquid mixture was diluted with pure liquid $CO_2$ to effect approximately 5 liquid turnovers in the drying chamber. Heat was then added to the liquid $CO_2$ causing a transition to the supercritical phase. The chamber containing the wafer is then drained and vented by maintaining the temperature of fluid and gas above the critical temperature of $CO_2$, thus avoiding the liquid phase. The wafer was removed from the chamber with no damage.

EXAMPLE 4

Treatment of a Coated Wafer with Supercritical Carbon Dioxide

Supercritical $CO_2$ was added to a high-pressure vessel that contained a piece of a PHS coated silicon wafer. A mixture that contained supercritical $CO_2$ and IPA, 2% IPA by volume, (alternatively any $CO_2$-miscible, hydrophilic solvent or surfactant that increased the carry capacity of $CO_2$ for water) was added to the high-pressure vessel that contained the piece of PHS coated silicon wafer and supercritical $CO_2$. No damage to the wafer was observed. The system was mixed for 15 minutes. There was still no damage to the wafer. A secondary gas (helium or nitrogen) was added to the top of the high-pressure vessel until the system became subcritical and a liquid meniscus was formed. The liquid $CO_2$/IPA mixture was drained under the pressure of the secondary gas to prevent boiling at the liquid/gas/wafer interface. There was no damage to the wafer after the system was drained with a secondary gas. The system was rinsed with pure liquid $CO_2$ and was then drained as mentioned above. There was no damage to the wafer.

COMPARATIVE EXAMPLE B

Solvation of Water from a Coated Wafer with Liquid Carbon Dioxide

A droplet of water was dripped on top of a piece of a PHS coated silicon wafer. The wafer that contained the water droplet was placed in the high-pressure view cell. Pure liquid $CO_2$ was added to the high-pressure vessel. The system was mixed for 15 minutes. The liquid $CO_2$ did not solvate the entire droplet of water as determined visually through a sapphire window on the view cell.

EXAMPLE 5

Solvation of Water from a Coated Wafer with Liquid Carbon Dioxide and Cosolvent

A droplet of water was dripped on top of a piece of a PHS coated silicon wafer. The wafer that contained the water droplet was placed in the high-pressure view cell. Liquid $CO_2$ was added to a high-pressure vessel that contained a piece of a PHS coated silicon wafer until the wafer was completely submerged in liquid $CO_2$. A mixture that contained liquid $CO_2$ and IPA, 2% IPA by volume, (alternatively any $CO_2$-miscible, hydrophilic solvent) was added to the high-pressure vessel that contained the piece of PHS coated silicon wafer submerged in liquid $CO_2$. No damage to the wafer was observed. The system was mixed for 15 minutes. The water droplet was completely solvated. There was still no damage to the wafer. A secondary gas (helium or nitrogen) was added to the top of the high-pressure vessel. The liquid $CO_2$/IPA mixture was drained under the pressure of the secondary gas to prevent boiling at the liquid/gas/wafer interface. There was no damage to the wafer after the system was drained with a secondary gas. The system was rinsed with pure liquid $CO_2$ and was then drained as mentioned above. There was no damage to the wafer.

EXAMPLE 6

Solvation of Water from a Coated Wafer with Liquid and Supercritical Carbon Dioxide and Cosolvent A whole 5" PHS coated wafer wetted with water, as it would be in an aqueous post-development process, was placed in the prototype drying chamber. The chamber was filled with liquid carbon dioxide. The prototype system contained a second high pressure vessel, containing liquid $CO_2$ plus 2% IPA by volume, (alternatively any $CO_2$-miscible, hydrophilic solvent or surfactant that increased the carry capacity of $CO_2$ for water) The mixed liquid $CO_2$/IPA was added to the drying chamber from the second high-pressure vessel using a pump. The system was mixed for 15 minutes. The liquid $CO_2$/IPA mixture was flushed with 5 liquid turnovers of pure liquid $CO_2$ so that the concentration of IPA dropped to a fraction of its previous concentration. There was no meniscus formation during the $CO_2$ flush. After the $CO_2$ flush, the liquid $CO_2$ was heated to 35° C. transitioning the fluid to a supercritical phase. The supercritical $CO_2$ was then drained/vented from the vessel as heat was added to maintain the fluid, and subsequently the gas, above the critical temperature of $CO_2$. When the chamber was completely vented the wafer was removed dry and undamaged.

EXAMPLE 7

Drying of Water from an Imaged and Aqueously Developed Resist-Coated Wafer Using $CO_2$ and Chemical Adjuncts A 5-inch silicon wafer coated with a PHS photoresist and a PAG was imaged, developed using 0.238 normal tetramethyl ammonium hydroxide, and rinsed with deionized water. The wet wafer was then transferred to a high-pressure drying chamber, where liquid $CO_2$ at saturated vapor pressure was added in a small amount. Additional liquid $CO_2$ at saturated vapor pressure premixed with a hydrophilic/$CO_2$-philic surfactant was added to and circulated through the chamber to displace and remove the water from the surface of the wafer and features of the resist pattern. After a short period of time the liquid was drained to a secondary storage vessel containing a small amount of liquid $CO_2$ first by allowing a vapor-side communication between the two vessels then by opening a valve connecting the bottom of the drying vessel with the bottom of the second storage vessel. The second storage vessel was position sufficiently below the drying chamber that the majority of the liquid drained from the drying chamber. The drying chamber was then filled with pure liquid $CO_2$ as a rinse followed by draining as described above. This was repeated to insure that the concentration of the adjunct was effectively zero. The small amount of remaining liquid $CO_2$ in the drying chamber was heated to above its critical point, 35° C., and the $CO_2$ was vented while maintaining the fluid/gas temperature above the critical temperature thus avoiding the formation of a liquid meniscus. The imaged, developed, and dried wafer was then removed from the chamber, stored in the absence of light and moisture, and then analyzed using a scanning electron microscope. The micrograph showed that the developed features, demonstrating line/space patterns of less than 120-nm, were consistent structurally unaffected by the $CO_2$ drying process.

EXAMPLE 8

MEM's Water and Contaminant Removal

During the manufacturing of a MEM's device containing a series of electrostatic actuators, a sacrificial oxide layer is removed using aqueous hydrofluoric acid, exposing a series of pivoting plates parallel to the substrate surface. After a sequential rinse step, the device is transferred to a high-pressure $CO_2$-based drying chamber, where a liquid $CO_2$ mixture is added at saturated vapor pressure. The liquid $CO_2$ contains a $CO_2$-philic/hydrophilic surfactant that is premixed with the $CO_2$ to ensure a homogeneous composition. After a period of circulation, pure liquid $CO_2$ is fed into the chamber as liquid $CO_2$, surfactant, water and entrained solutes are removed from the vessel at constant pressure. The liquid $CO_2$ remaining in the chamber is then heated to above its critical temperature converting the fluid into the supercritical state. The supercritical fluid in the processing chamber is then vented into a storage tank serving to ensure that the temperature of the fluid/gas mixture stays above the critical temperature of $CO_2$. This serves to ensure that the liquid state, a liquid meniscus, and associated surface tension are avoided during the draining/venting step. An SEM analysis of the MEM's device shows that the pivoting plates are all substantially parallel to the substrate surface with no evidence of release stiction.

EXAMPLE 9

Post CMP Cleaning

Polishing slurry, polishing residues and particulates are removed post-CMP using the following process steps. The substrate, a semiconductor wafer with a metal or dielectric surface, is loaded into a pressure vessel. An aqueous solution of hydrogen peroxide (30% concentration in water) in a liquid $CO_2$ emulsion containing a high purity $CO_2$-philic-b-hydrophilic surfactant is introduced at 1,200 psi and room temperature. Cyclical phase modulation is used to condense the emulsion onto the surface of the wafer followed by re-emulsification. This is accomplished by increasing the effective volume of the cleaning chamber causing a reduction in pressure from 1200 psi at room temperature to 790 psi at about 15 C. The volume is increased using an automated variable volume cylinder and appropriate valves. The aqueous cleaning solution is condensed onto the surface of the wafer for a short period of time as the density of the liquid $CO_2$ is reduced. The pressure is then increased by a reduction of vessel volume restoring the pressure in the cleaning chamber to 1200 psi. The cycle is repeated 20 times. The first solution is then displaced from the vessel by a second cleaning solution consisting of an aqueous fluoride in $CO_2$ emulsion with a high purity $CO_2$-philic-b-hydrophilic surfactant. The pressure is then modulated cyclically as above, 20 times. Supercritical $CO_2$ at 1800 psi and 40 C, with a high purity surfactant is then flowed through the vessel to facilitate the removal of any remaining particulates. A supercritical $CO_2$ rinse is then completed by addition of pure $CO_2$ to the vessel. The system is vented a final time and the substrate is removed.

EXAMPLE 10

Polishing slurry, polishing residues and particulates are removed post-CMP using the following process steps. The substrate, a semiconductor wafer with a metal or dielectric surface, is loaded into a pressure vessel. An aqueous solution of hydrogen peroxide in a liquid $CO_2$ emulsion containing a high purity $CO_2$-philic-b-hydrophilic surfactant is introduced at 1,200 psi and room temperature. The aqueous cleaning solution is condensed onto the surface of the wafer for a short period of time using a variable volume chamber connecting to the cleaning vessel. The pressure is then increased by a reduction of vessel volume to restore the pressure to the original value. The cycle is repeated 20 times. The first solution is displaced from the vessel by a second cleaning solution consisting of an aqueous fluoride in $CO_2$ emulsion with a high purity $CO_2$-philic-b-hydrophilic surfactant. The pressure is then modulated as above 20 times using a variable volume chamber. Supercritical $CO_2$ containing a small amount $CO_2$-soluble chelating agent (ethylenediaminetetraacetic acid) is then flowed through the vessel to facilitate the removal of any remaining metal ions. Supercritical $CO_2$ with a high purity surfactant is then flowed through the vessel to facilitate the removal of any remaining particulate mater. A supercritical $CO_2$ rinse is then completed by addition of pure $CO_2$ to the vessel. The system is vented a final time and the substrate removed.

EXAMPLE 11

Photoresist is used to pattern substrates for ion implantation. The photoresist used for this process is removed in the following steps. The substrate, a semiconductor post ion implantation, is loaded into a pressure vessel. Supercritical $CO_2$ is added to the vessel at 3,000 psi and 35° C. As the supercritical $CO_2$ circulated through the vessel, a co-solvent mixture consisting of triethanolamine, N-methyl-2-pyrrolidone, a surfactant containing both $CO_2$-philic and hydrophilic components, and water are added. The mixture composition by weight is 7:2:1:1, and the total concentration of adjunct added is 2.5% w/v of the fluid system. The pressure of the vessel is reduced using a variable volume chamber and appropriate valves causing an expansion of the processing fluid in the cleaning chamber and thereby condensing a concentrated mixture of the adjunct mixture onto the surface of the substrate. The temperature of the mixture drops below the $T_c$ in the course of the expansion causing a transition to liquid CO2. The system is re-pressurized and the fluid mixture heated above $T_c$ again using the variable volume chamber and internal heaters. This cycle is repeated 20 times and followed by a pure supercritical $CO_2$ rinse. The system is vented and the substrate removed.

EXAMPLE 12

Polymeric photoresist and resist residue is removed from via structures of a test wafer after reactive ion etching using the following process steps. An amine (triethylamine) in supercritical $CO_2$ plus a high purity surfactant with both a $CO_2$-philic and an oleophilic segment is added to the vessel at 3,000 psi at 60° C. (2% w/v amine, 1% w/v surfactant). The fluid mixture is circulated through the vessel. The pressure of the fluid mixture is rapidly reduced to 1,500 psi thereby condensing the adjunct onto the surface of the substrate. The pressure is then rapidly increased back to 3,000 psi re-dispersing all chemical adjuncts. The cycle is repeated 20 times using a variable volume chamber. Heat is added to the chamber using an internal heater to maintain the temperature as near to 60° C. as possible. Helium gas at 3500 psi was then added to the cleaning chamber as a valve at the bottom of the chamber was opened to a waste vessel. The processing fluid was rapidly flushed from the chamber and replaced by a pressurized atmosphere of pure helium. After the helium was vented off the cleaning vessel was rinsed with pure supercritical $CO_2$ A second cleaning solution consisting of a co-solvent (2,4-pentanedione, 3% w/v total) and a high purity surfactant (1% w/v) was added to the cleaning vessel with $CO_2$ at 3000 psi and 60 C. The pressure of the system is modulated as described above 20 times while the temperature of the fluid is maintained as close to 60° C. as possible using an internal heater. The cleaning fluid was drained as above using helium as a secondary gas. Finally, a pure supercritical $CO_2$ rinse is completed, the system was drained using helium as a secondary gas and then vented, and the substrate removed.

The foregoing is illustrative of the present invention, and is not to be construed as limiting thereof. The invention is defined by the following claims, with equivalents of the claims to be included therein.

That which is claimed is:

1. A method of cleaning contaminants from a microelectronic device, comprising the steps of:

providing a substrate having a surface portion to be cleaned, providing a densified carbon dioxide cleaning composition, said cleaning composition comprising carbon dioxide and a cleaning adjunct, said cleaning adjunct selected from the group consisting of cosolvents, surfactants, and combinations thereof;

immersing said surface portion in said densified carbon dioxide cleaning composition; and then removing said cleaning composition from said surface portion; while inhibiting redeposition of contaminants on said surface portion.

2. The method according to claim 1, wherein said densified carbon dioxide cleaning composition is a supercritical fluid, and said inhibiting step is carried out by:

introducing a clean secondary gas into said supercritical fluid cleaning composition; and removing said supercritical fluid from said surface portion under pressure from said secondary gas.

3. The method according to claim 1, wherein said densified carbon dioxide cleaning composition is a supercritical fluid, and said inhibiting step is carried out by:

introducing clean heated supercritical $CO_2$ into said supercritical fluid cleaning composition; and removing said supercritical fluid from said surface portion under pressure from said heated supercritical $CO_2$.

4. The method according to claim 1, wherein said densified carbon dioxide cleaning composition is a liquid, and said inhibiting step is carried out by:

introducing a clean secondary gas into said liquid cleaning composition; and removing said liquid cleaning composition from said surface portion under pressure from said secondary gas.

5. The method according to claim 1, wherein said densified carbon dioxide cleaning composition is a liquid, and said inhibiting step is carried out by:

introducing clean heated gas or supercritical $CO_2$ into said supercritical fluid cleaning composition; and removing said liquid cleaning composition from said surface portion under pressure from said heated gas or supercritical $CO_2$.

6. The method according to claim 1, wherein said densified cleaning composition is a liquid and is at saturated vapor pressure, and said removing step is carried out by draining said liquid with vapor side communication between said cleaning chamber and a receiving vessel.

7. The method according to claim 1, further comprising:

maintaining said cleaning composition as a homogeneous composition during at least one of said immersing step and said removing step.

8. The method according to claim 1, wherein said microelectronic device comprises a microelectromechanical device.

9. The method according to claim 1, wherein said microelectronic device comprises an optoelectronic device.

10. The method according to claim 1, wherein said microelectronic device comprises a resist-coated substrate.

11. The method according to claim 1, wherein said carbon dioxide is supercritical carbon dioxide.

12. The method according to claim 1, wherein said cleaning adjunct comprises a co-solvent.

13. The method according to claim 1, wherein said cleaning adjunct comprises a surfactant.

14. The method according to claim 1, wherein said providing a densified carbon dioxide cleaning composition step is carried out by mixing said carbon dioxide with said adjunct to produce a homogeneous solution.

15. The method according to claim 1, wherein said cleaning composition is a liquid cleaning composition, wherein said immersing and removing steps are carried out in an enclosed chamber, and wherein said removing step is carried out by pressurizing said enclosed chamber with a second compressed gas by an amount sufficient to inhibit boiling of said drying composition.

16. The method according to claim 1, wherein said cleaning composition is a supercritical cleaning composition, wherein said immersing and removing steps are carried out in an enclosed chamber, and wherein said removing step is carried out by adding a second material to said supercritical cleaning composition so that it is converted to a liquid cleaning composition.

17. The method according to claim 1, wherein said removing step is carried out by diluting said cleaning composition with additional carbon dioxide.

18. A method a cording to claim 1, wherein said cleaning step is initiated with said cleaning composition in a liquid state, and after a period of time said inhibiting step is carried out by diluting said composition with pure liquid $CO_2$ and then heating said composition produce a supercritical fluid, followed by removing said supercritical fluid while maintaining the temperature of the fluid and gas above the critical temperature of $CO_2$.

19. A method according to claim 1, wherein said cleaning comprises removal of water from said device.

* * * * *